United States Patent [19]

Inokuti et al.

[11] Patent Number: 4,698,272
[45] Date of Patent: Oct. 6, 1987

[54] EXTRA-LOW IRON LOSS GRAIN ORIENTED SILICON STEEL SHEETS

[75] Inventors: Yukio Inokuti; Yo Ito, both of Chiba, Japan

[73] Assignee: Kawasaki Steel Corporation, Hyogo, Japan

[21] Appl. No.: 832,172

[22] Filed: Feb. 21, 1986

[30] Foreign Application Priority Data

| Feb. 22, 1985 | [JP] | Japan | 60-32935 |
| Apr. 22, 1985 | [JP] | Japan | 60-84523 |
| Jul. 23, 1985 | [JP] | Japan | 60-161221 |
| Jul. 23, 1985 | [JP] | Japan | 60-161223 |
| Jul. 23, 1985 | [JP] | Japan | 60-161227 |
| Jul. 23, 1985 | [JP] | Japan | 60-161228 |
| Aug. 16, 1985 | [JP] | Japan | 60-180161 |
| Aug. 16, 1985 | [JP] | Japan | 60-180162 |
| Aug. 16, 1985 | [JP] | Japan | 60-180163 |
| Aug. 16, 1985 | [JP] | Japan | 60-180164 |
| Dec. 17, 1985 | [JP] | Japan | 60-282053 |
| Feb. 6, 1986 | [JP] | Japan | 61-22848 |

[51] Int. Cl.⁴ .......................................... B32B 15/04
[52] U.S. Cl. .................... 428/627; 428/469; 428/472; 428/446; 428/704; 428/900; 428/622; 148/308
[58] Field of Search .................. 148/31.5, 31.55, 307, 148/308; 428/469, 472, 900, 446, 704, 622, 627

[56] References Cited

U.S. PATENT DOCUMENTS

| 3,932,236 | 1/1976 | Wada et al. | 148/31.5 |
| 3,940,291 | 2/1976 | Evans | 148/31.55 |
| 3,941,623 | 3/1976 | Takashina et al. | 148/31.5 |
| 4,280,856 | 7/1981 | Inokuti et al. | 148/111 |

Primary Examiner—John P. Sheehan
Attorney, Agent, or Firm—Austin R. Miller

[57] ABSTRACT

An extra-low iron loss grain oriented silicon steel sheet comprises a base metal of silicon steel and a thin coat of nitride or carbide of Ti, Zr, Hf, V, Nb, Ta, Mn, Cr, Mo, W, Co, Ni, Al, B and Si and strongly adhered to a finished surface of the base metal through a mixed layer of the base metal and the thin coat, and has excellent electrical and magnetic properties as well as good compressive stress dependence of magnetostriction and lamination factor.

12 Claims, 4 Drawing Figures

FIG_2

EXTRA-LOW IRON LOSS GRAIN ORIENTED SILICON STEEL SHEETS

BACKGROUND OF THE INVENTION

1. Field of the Invention

This invention relates to an extra-low iron loss grain oriented silicon steel sheet, and more particularly to an extra-low iron loss grain oriented silicon steel sheet suitable for use in electrical machinery and equipment having excellent heat stability, compressive stress dependence of magnetostriction and lamination factor.

2. Related Art Statement

Lately, remarkable developments and efforts for satisfying the improvement of electrical and magnetic properties in grain oriented silicon steels, particularly ultimate demand on reduction of iron loss are gradually producing good results. However, when using such grain oriented silicon steel sheets, it is a serious problem that the degradation of the above properties is unavoidably caused when the steel sheet is subjected to a so-called strain relief annealing after its working and assembling and the use application is restricted considerably and undesirably.

Throughout the specification, the invention will be described with respect to developmental results on new measures for advantageously satisfying the above demands irrespectively of a high temperature heat treatment such as strain relief annealing, particularly for profitably providing desirable compressive stress dependence of magnetostriction and lamination factor in grain oriented silicon steel sheets.

As is well-known, the grain oriented silicon steel sheet, wherein secondary recrystallized grains are highly aligned in $\{110\}<001>$ orientation, namely Goss orinetation, is mainly used as a core for transformer and other electrical machinery and equipment. In this case, it is required that the magnetic flux density (represented by $B_{10}$ value) is high, the iron loss (represented by $W_{17/50}$ value) is low and, in addition to this superior magnetic properties, the magnetostriction property and lamination factor are excellent.

Since these grain oriented silicon steel sheets are usually manufactured through many complicated steps, inventions and improvements are applied to the above steps, whereby low iron loss grain oriented silicon steel sheets having $B_{10}$ of not less than 1.90 T and $W_{17/50}$ of not more than 1.05 W/kg when the product thickness is 0.30 mm or $B_{10}$ or not less than 1.89 T and $W_{17/50}$ of not more than 0.90 W/kg when the product thickness is 0.23 mm are manufactured up to the present.

Lately, supreme demands on the reduction of power loss become considerable in view of energy-saving. Particularly, a system of "Loss Evaluation", wherein the reduction percentage of iron is converted into a load on the cost of the transformer in the manufacture of low loss transformer, is widely spread in Europe and America.

Under the above circumstances, there has recently been proposed a method wherein local microstrain is introduced into the surface of the grain oriented silicon steel sheet by irradiating a laser beam onto the steel sheet surface in a direction substantially perpendicular to the rolling direction after the finish annealing to thereby conduct refinement of magnetic domains and hence reduce the iron loss (Japanese Patent Application Publication Nos. 57-2,252, 57-53,419, 58-5,968, 58-26,405, 58-26,406, 58-26,407 and 58-36,051).

Such a magnetic domain refinement is effective for grain oriented silicon steel sheet not subjected to strain relief annealing in the manufacture of stacked lamination-core type transformers. However, in case of wound-core type transformers, the strain relief annealing is performed after the magnetic domain refinement, so that the local microstrain produced by laser irradiation on purpose is released by the annealing treatment to make the width of magnetic domains wide and consequently the laser irradiating effect is lost.

On the other hand, Japanese Patent Application Publication No. 52-24,499 discloses a method of producing an extra-low iron loss grain oriented silicon steel sheet wherein the surface of the grain oriented silicon steel sheet is subjected to a mirror finishing after the final annealing or a metal thin plating is applied to the mirror finished surface or further an insulation coating is baked thereon.

However, the mirror finishing for improving the iron loss does not sufficiently contribute to the reduction of iron loss in comparison with remarkable cost-up of the manufacturing step. Particularly, there is a problem on the adhesion property to the insulation coating indispensably applied and baked after the mirror finishing. Therefore, such a mirror finishing is not yet adopted in the present manufacturing step.

Further, there is proposed a method, wherein the steel sheet surface is subjected to the mirror finishing and then a thin coat of oxide ceramics is deposited thereon, in Japanese Patent Application Publication No. 56-4,150. In this method, however, the ceramic coat is peeled off from the steel sheet surface when subjected to high temperature annealing above 600° C., so that it can not be adopted in the actual manufacturing step.

Moreover, the magnetostriction of the grain oriented silicon steel sheet is a phenomenon that the steel sheet is subjected to stretching vibrations durng the magnetization of the steel sheet, which is a most serious cause of the occurence of noise in the transformer.

The magnetostriction behavior results from the fact that the magnetization process of the steel sheet includes 90° boundary displacement and rotation magnetization. That is, the magnetostriction increases in accordance with compressive stress applied to the steel sheet.

Since the compressive stress is irreversibly applied to the steel sheet in the manufacture of the transformer, it is advantageous that tension is previously applied to the steel sheet in view of the compressive stress dependence of magnetostriction. Of course, the application of the tension to the steel sheet is effective for improving the iron loss in the grain oriented silicon steel sheet, and its effect is conspicuous.

In general, the grain oriented silicon steel sheet is subjected to tension by a double coating consisting of a forsterite layer, which is produced by high temperature reaction between an iron oxide of fayalite ($Fe_2SiO_4$) usually formed on the steel sheet surface through decarburization and primary recrystallization annealing before secondary recrystallization and an annealing separator composed mainly of MgO in the final annealing, and an insulation coating produced on the forsterite layer and composed mainly of phosphate and colloidal silica, whereby the magnetostriction property is improved. However, it can not be said that the compressive stress dependence of magnetostriction is sufficiently improved by such a conventional method.

In order to improve the magnetostriction property, there has been attempted the development of insulation coating capable of applying an elastic tension to the steel sheet surface (Japanese Patent Application Publication No. 56-521,117 or 53-28,375). However, such an attempt is still lacking in effectiveness.

Further, the lamination factor of the grain oriented silicon steel sheet is expressed by an amount (percentage) of base metal effectively contributing to magnetic properties, which is obtained by removing forsterite layer and vitreous insulation coating from the surface of the steel sheet during the final annealing. It is said that the increase of such a lamination factor in the grain oriented silicon steel is one of the most important properties. In general, it is known that the surface roughness of the steel sheet is made as small as possible or the thickness of each of the forsterite layer and vitreous insulation coating is made thin for increasing the lamination factor of the product. However, although the thinning of these coatings increases the lamination factor, it is very difficult to stably form a thin coating having a good surface appearance and excellent adhesion property and uniformity at the actual manufacturing step, so that there is a limit in the increase of the lamination factor.

SUMMARY OF THE INVENTION

It is, therefore, an object of the invention to advantageously improve the compressive stress dependence of magnetostriction and the lamination factor in the grain oriented silicon steel sheet while forming an extra thin tensile coat on the steel sheet surface for effectively leading the improvement of iron loss by mirror finishing.

It is another object of the invention to overcome the problems on the adhesion property and durability of the insulation coating without causing the degradation of characteristics even though exposed to high temperature treatment.

The invention is based on the discovery that a thin coat of at least one layer composed of nitride and/or carbide as mentioned later, which is strongly adhered to the finished surface of the grain oriented silicon steel sheet, can extremely reduce the iron loss and simultaneously achieve the improvement of heat stability, compressive stress dependence of magnetostriction and lamination factor.

According to the invention, there is provided an extra-low iron loss grain oriented silicon steel sheet comprising a base metal of silicon steel and a thin coat of at least one layer composed of at least one of the nitrides and carbides of Ti, Zr, Hf, V, Nb, Ta, Mn, Cr, Mo, W, Co, Ni, Al, B and Si, strongly adhered to a finished surface of the base metal through a mixed layer of the base metal and the thin coat. Thus, the grain oriented silicon steel sheet according to the invention has excellent magnetic properties such as high magnetic flux density, extra-low iron loss and so on, and improved heat stability, compressive stress dependence of magnetostriction and lamination factor.

In the grain oriented silicon steel sheet according to the invention, a tension is always applied to the surface of the steel sheet owing to the difference in thermal expansion coefficient between the base metal and the thin coat, whereby a fairly low iron loss is obtained. Moreover, the extra-low iron loss is stably obtained when the thin coat is formed on the base metal surface while further applying a tension of not more than 2 kg/mm$^2$ to the base metal.

In a preferred embodiment of the invention, an insulation coating composed mainly of phosphate and colloidal silica is formed on the thin coat for the promotion of electrical insulation.

BRIEF DESCRIPTION OF THE DRAWINGS

The invention will be described with reference to the accompanying drawings, wherein.

DESCRIPTION OF THE PREFERRED EMBODIMENTS

The invention will first be described with respect to experimental details resulting in the success of the invention.

A continuously cast slab of silicon steel comprising 0.046% by weight of C, 3.34% by weight of Si, 0.068% by weight of Mn, 0.023% by weight of Se, 0.025% by weight of Sb and 0.025% by weight of Mo was heated at 1,360° C. for 4 hours and then hot rolled to obtain a hot rolled steel sheet having a thickness of 2.0 mm.

The hot rolled steel sheet was subjected to a normalized annealing at 900° C. for 3 minutes, which was then subjected to a cold rolling two times through an intermediate annealing at 950° C. for 3 minutes to obtain a final cold rolled steel sheet having a thickness of 0.23 mm.

After the cold rolled steel sheet was subjected to decarburization and primary recrystallization annealing in a wet hydrogen atmosphere at 820° C., a slurry of an annealing separator composed mainly of MgO was applied onto the surface of the steel sheet. Then, the steel sheet was subjected to a secondary recrystallization annealing at 850° C. for 50 hours and further to a purification annealing in a dry hydrogen atmosphere at 1,200° C. for 5 hours.

Thereafter, the thus treated steel sheet was pickled with a solution of H$_2$SO$_4$ at 80° C. to remove a forsterite layer from the steel sheet surface. Next, the steel sheet was subjected to a chemical polishing with a mixed solution of 3% HF and H$_2$O$_2$, whereby the surface of the steel sheet was rendered into a mirror finished state having a center-line average roughness of 0.1 μm.

Figure 1:
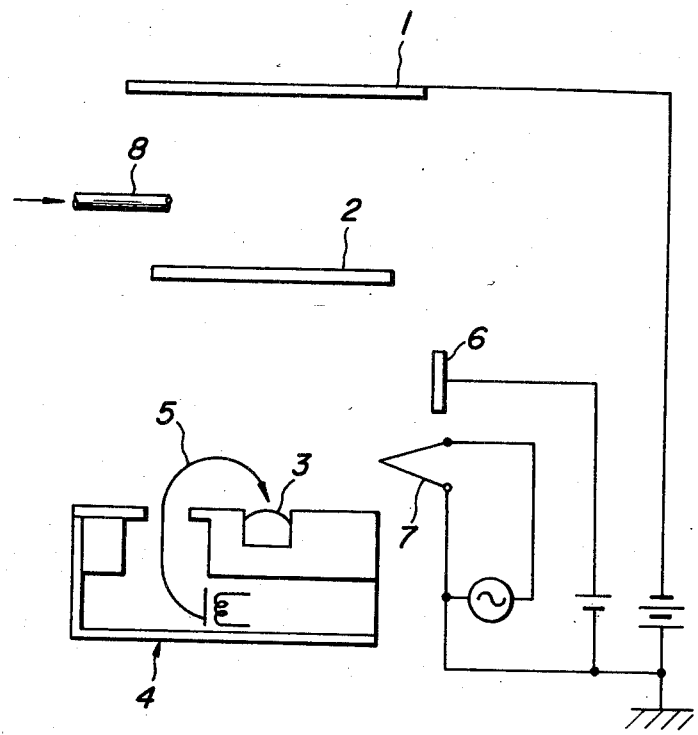
FIG. 1 is a diagrammatic view of an ion plating apparatus used in the manufacture of the extra-low iron loss grain oriented silicon steel sheet according to the invention.

Then, a thin coat of Al$_2$O$_3$ or TiN with a thickness of 0.5 μm was formed on the mirror finished surface of the steel sheet by using an ion plating apparatus shown in FIG. 1.

In FIG. 1, numeral 1 is a mirror finished base metal to be tested, numeral 2 a shutter, numeral 3 a crucible, numeral 4 an electron gun, numeral 5 an electron beam, numeral 6 an ionization electrode, numeral 7 a thermionic emission electrode, and numeral 8 an inlet for reactive gas such as N$_2$, C$_2$H$_2$, O$_2$ or the like.

After the ion plating, the steel sheet was subjected to a coating treatment with a coating solution consisting mainly of phosphate and colloidal silica (i.e. the information of an insulation baked coating).

For the comparison, the mirror finished surface of the steel sheet was subjected to a copper vapor evaporation treatment at a thickness of 0.5 μm in the conventionally well-known manner and then the same coating treatment as described above was applied thereto.

The magnetic properties and adhesion property of the resulting products were measured to obtain results as shown in the following Table 1.

TABLE 1

| Treating conditions | Magnetic properties | | Adhesion property | | Total thickness (mm) |
| | $B_{10}$ (T) | $W_{17/50}$ (W/kg) | bending diameter* (mm) | evaluation** | |
| --- | --- | --- | --- | --- | --- |
| (a) conventional treatment (formation of insulation coating on forsterite layer) | 1.905 | 0.87 | 30 | o | 0.229 |
| (b) formation of insulation coating after evaporating treatment on mirror finished surface | 1.913 | 0.73 | 50 | x | 0.223 |
| (c) formation of insulation coating after ion plating of $Al_2O_3$ on mirror finished surface | 1.915 | 0.72 | 45 | x | 0.220 |
| (d) formation of insulation coating after ion plating of TiN on mirror finished surface | 1.920 | 0.68 | 30 | o | 0.221 |

*diameter causing no peeling at 180° bending
**o: good
x: bad

As seen from Table 1, the conventional product (a) obtained by applying the coating treatment to the forsterite layer formed on the steel sheet surface in the finish annealing has $B_{10}$ of 1.905 T and $W_{17/50}$ of 0.87 W/kg as magnetic properties, wherein the adhesion property of the insulation coating is good in a way. While, when the product (b) is manufactured by removing the forsterite layer formed on the steel sheet surface during the final annealing through pickling, rendering the forsterite-free steel sheet surface into a mirror finished state through chemical polishing, and then subjecting such a mirror finished surface to a copper vapor evaporation and a coating treatment, the magnetic properties ($B_{10}$=1.913 T, $W_{17/50}$=0.73 W/kg) are moderately improved, but the adhesion property is bad.

On the other hand, in the product (c) obtained by repeating the same procedure as in the product (b) except that the ion plating of $Al_2O_3$ was conducted instead of the copper vapor evaporation, the magnetic properties ($B_{10}$=1.915 T, $W_{17/50}$=0.72 W/kg) are somewhat improved, but the adhesion property of the $Al_2O_3$ thin coat including the insulation coating is still bad though it is somewhat better than that of the product (b).

On the contrary, the product (d) obtained by repeating the same procedure as in the product (b) except that the ion plating TiN was conducted instead of the copper vapor evaporation has very excellent magnetic properties of $B_{10}$=1.920 T and $W_{17/50}$=0.68 W/kg and a good adhesion property.

Figure 2:
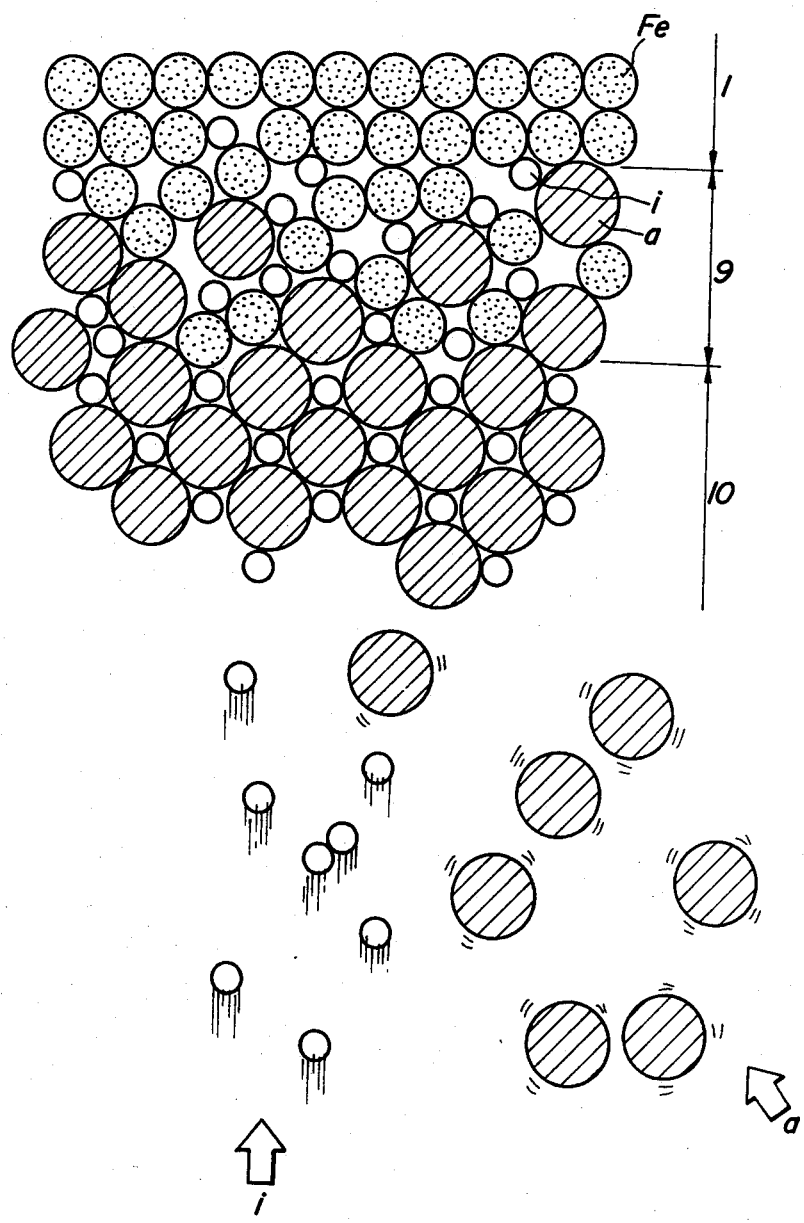
FIG. 2 is a schematic view illustrating behaviors of accelerated ions and deposition atoms.

According to the invention, the improvement of the magnetic properties and adhesion property is based on the following fact. That is, as schematically shown in FIG. 2, a mixed layer 9 of the accelerated ions i and deposition atoms a is formed on the finished surface of the silicon steel sheet as a base metal 1 to considerably enhance the adhesion property of a thin coat 10 to the base metal 1 through the mixed layer 9, and consequently a strong tension is applied to the surface of the silicon steel sheet to thereby realize an extra-low iron loss which has never been attained in the prior art. In this case, the action of plastic microstrain is not utilized, so that there is caused no problem on the heat stability, and consequently the electrical and magnetic properties are not influenced under a high temperature heat treatment such as strain relief annealing.

In order to provide an extra-low iron loss product, the surface of the steel sheet is particularly required to be a mirror finished state having a centerline average roughness (Ra) of not more than 0.4 μm. However, when Ra is more than 0.4 μm, the degree of reduction of iron loss tends to somewhat decrease, but is still superior as compared with the case of performing the conventionally well-known method. According to the invention, the effect of reducing the iron loss can be expected even when the oxides are removed from the steel sheet surface by a chemical process such as pickling or a mechanical process such as cutting or grinding as mentioned later.

According to the invention, the thin coat is desired to have a thickness of 0.005-2 μm, preferably 0.05-1.5 μm. When the thickness is less than 0.005 μm, the application of the required tension can not be attained, while when it exceeds 2 μm, the lamination factor and adhesion property are unfavorably degraded.

The strong adhesion of the thin coat to the mirror finished surface of the steel sheet through the mixed layer is advantageously produced by anyone of PVD (physical vapor deposition) process such as ion plating, ion implatation or the like and CVD (chemical vapor deposition) process. Besides, there may be employed a method wherein a metal is deposited on the mirror finished surface of the steel sheet and then reacted near this surface in its atmosphere to form a desired thin coat.

Next, the invention will be described with respect to experimental results on the compressive stress dependence of magnetostriction in the grain oriented silicon steel sheet.

A continuously cast slab of silicon steel comprising 0.045% by weight of C, 3.38% by weight of Si, 0.063% by weight of Mn, 0.021% by weight of Se, 0.025% by weight of Sb and 0.025% by weight of Mo was heated at 1,340° C. for 4 hours and then hot rolled to obtain a hot rolled steel sheet having a thickness of 2.0 mm.

Then, the hot rolled steel sheet was subjected to a normalized annealing at 900° C. for 3 minutes and further to a cold rolling two times through an intermediate annealing at 950° C. for 3 minutes to obtain a final cold rolled steel sheet having a thickness of 0.23 mm.

Thereafter, the thus obtained steel sheet was subjected to decarburization and primary recrystallization annealing at 820° C. in a wet hydrogen atmosphere, coated with a slurry of an annealing separator composed of $Al_2O_3$ (70%) and MgO (30%), and then subjected to a secondary recrystallization annealing at 850° C. for 50 hours and further to a purification annealing at 1,200° C. in a dry hydrogen atmosphere for 5 hours.

The thus treated steel sheet was pickled with a solution of HCl at 70° C. to remove oxides from the steel sheet surface and then subjected to a chemical polishing with a mixed solution of 3% HF and $H_2O_2$ to render the surface into a mirror finished state having a center-line average roughness of 0.05 $\mu$m.

Then, a thin coat of TiN with a thickness of 0.7 $\mu$m was formed on the mirror finished surface by CVD process wherein the steel sheet was subjected to CVD reaction in a mixed gas atmosphere of $TiCl_4$, $H_2$ and $N_2$ at 750° C. for 20 hours. After an insulation coating consisting mainly of phosphate and colloidal silica was formed on the thin coat by baking, the steel sheet was subjected to a strain relief annealing at 800° C. for 2 hours to obtain a desired product.

Figure 3:
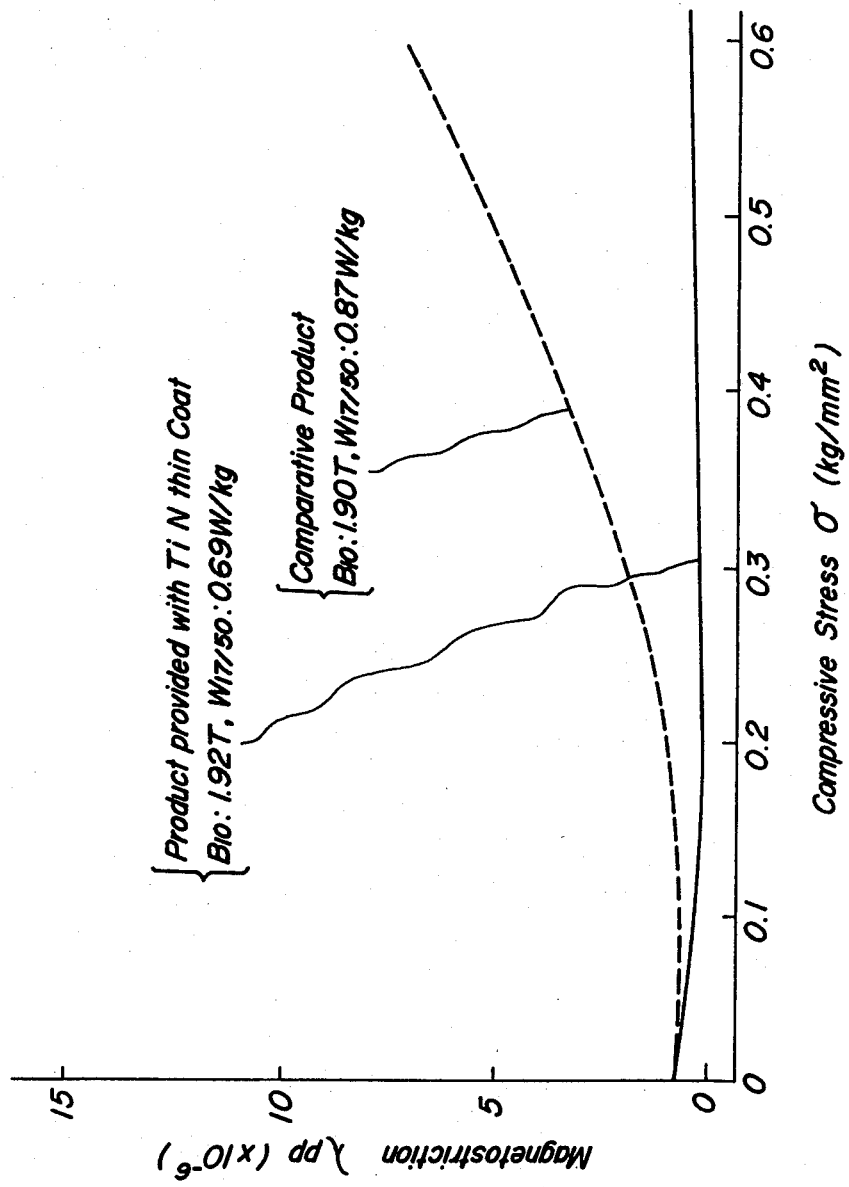
FIGS. 3 and 4 are graphs showing compressive stress dependence of magnetostriction in the grain oriented silicon steel sheet having an extra thin AlN or TiN coat according to the invention and the grain oriented silicon steel sheet obtained by the conventional manufacturing process, respectively.

The compressive stress dependence of magnetostriction and magnetic properties of the resulting product are shown in FIG. 3 together with those of a comparative product obtained by the usual manufacturing process.

Moreover, the comparative product was manufactured by subjecting the same final cold rolled steel sheet as described above to decarburization and primary recrystallization annealing at 820° C. in a wet hydrogen atmosphere, applying an annealing separator composed mainly of MgO to form a forsterite layer, subjecting to a secondary recrystallization annealing at 850° C. for 50 hours and a purification annealing at 1,200° C. in a dry hydrogen atmosphere for 5 hours and baking an insulation coating consisting mainly of phosphate and colloidal silica onto the forsterite layer.

As seen from FIG. 3, the product provided with the TiN thin coat according to the invention has very excellent magnetic properties of $B_{10}=1.92$ T and $W_{17/50}=0.69$ W/kg, and also the increase of magnetostriction ($\lambda_{pp}$) is very little even when the compressive stress ($\sigma$) is increased up to 0.6 kg/mm$^2$.

On the contrary, in the comparative product (manufactured by the usual manufacturing process), $B_{10}$ is 1.90 T and $W_{17/50}$ is 0.87 W/kg as magnetic properties, but the magnetostriction ($\lambda_{pp}$) increases with the increase of the compressive stress ($\sigma$). Fo instance, the magnetostriction exhibits a large value of $\lambda_{pp}=3.2\times10^{-6}$ at the compressive stress ($\sigma$) of 0.4 kg/mm$^2$.

Further, the invention will be described with respect to experimental results on the magnetic properties, lamination factor and compressive stress dependence of magnetostriction in another grain oriented silicon steel sheet.

A continuously cast slab of silicon steel comprising 0.043% by weight of C, 3.36% by weight of Si, 0.062% by weight of Mn, 0.021% by weight of Se, 0.025% by weight of Sb and 0.025% by weight of Mo was heated at 1,360° C. for 4 hours and then hot rolled to obtain a hot rolled steel sheet having a thickness of 2.4 mm.

The hot rolled steel sheet was subjected to a normalized annealing at 900° C. for 3 minutes and further to a cold rolling two times through an intermediate annealing at 950° C. for 3 minutes to obtain a final cold rolled steel sheet having a thickness of 0.23 mm.

Next, the cold rolled steel sheet was subjected to decarburization and primary recrystallization annealing at 820° C. in a wet hydrogen atmosphere, coated with an annealing separator composed of $Al_2O_3$ (70%) and MgO (30%), and then subjected to a secondary recrystallization annealing at 850° C. for 50 hours and further to a purification annealing at 1,200° C. in a dry hydrogen atmosphere for 5 hours.

Thereafter, the steel sheet was pickled with a solution of HCl at 50° C. to remove oxides from the steel sheet surface and then subjected to a chemical polishing with a mixed solution of 3% HF and $H_2O_2$ to render the surface into a mirror finished state having a center-line average roughness of 0.05 $\mu$m.

Next, a thin coat of AlN with a thickness of 0.8 $\mu$m was formed on the mirror finished surface by CVD process wherein the steel sheet was subjected to CVD reaction in a mixed gas atmosphere of $AlCl_3$, $H_2$ and $N_2$ at 800° C. for 15 hours. After an insulation coating consisting mainly of phosphate and colloidal silica was formed on the thin coat by baking, the steel sheet was subjected to a strain relief annealing at 800° C. for 2 hours to obtain a desired product.

Figure 4:
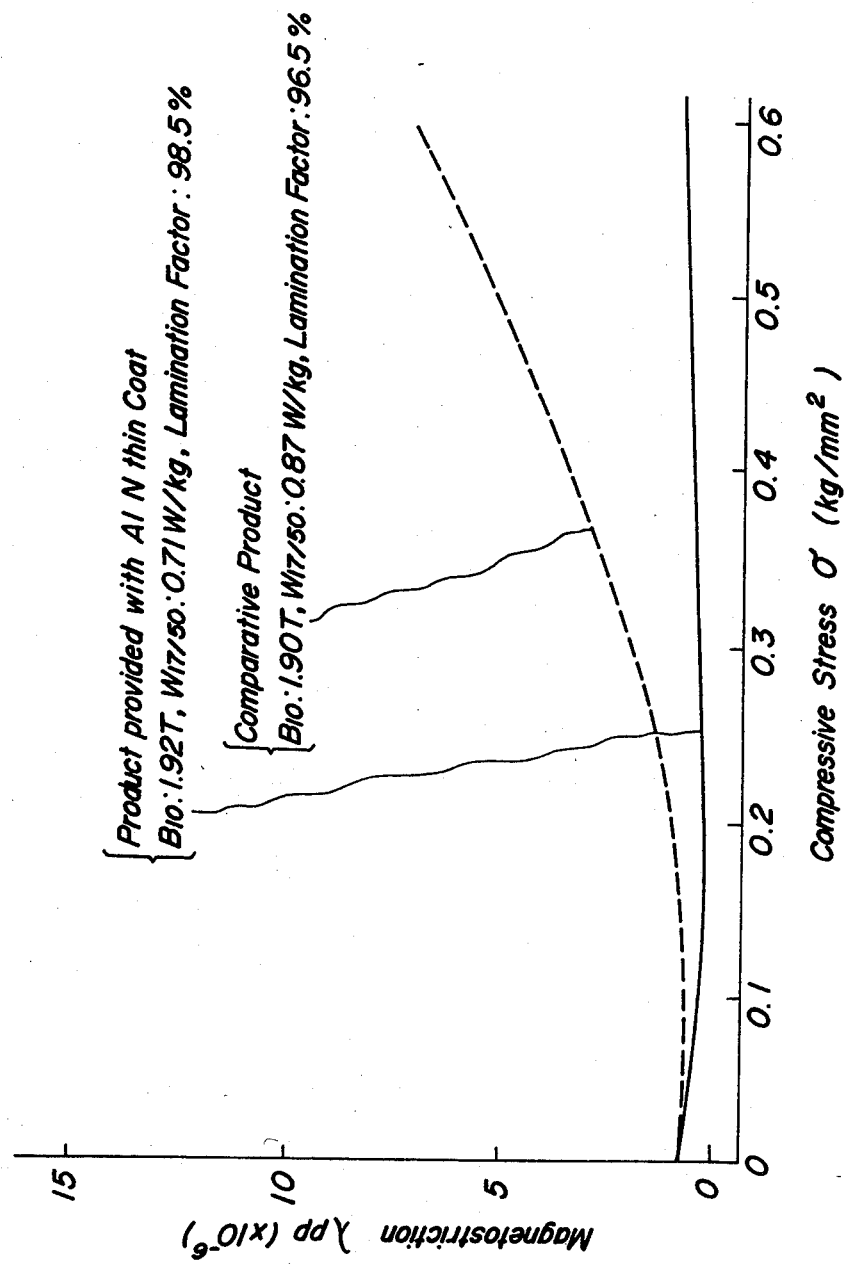

The compressive stress dependence of magnetostriction, magnetic properties and lamination factor of the resulting product are shown in FIG. 4 together with those of another comparative product obtained by starting from the above cold rolled steel sheet in the same manner as described on the comparative product of FIG. 3.

As seen from FIG. 4, the product provided with the AlN thin coat according to the invention has very excellent magnetic properties of $B_{10}=1.92$ T and $W_{17/50}=0.71$ W/kg, and is very little in the increase of magnetostriction ($\lambda_{pp}$) because $\lambda_{pp}$ is $0.25\times10^{-6}$ at a compressive stress ($\sigma$) of 0.4 kg/mm$^2$ and $0.70\times10^{-6}$ at $\sigma$ of 0.6 kg/mm$^2$. Further, it should be noted that the lamination factor is extremely increased to 98.5%.

On the contrary, in the comparative product, $B_{10}$ is 1.90 T and $W_{17/50}$ is 0.87 W/kg as magnetic properties, but the magnetostriction ($\lambda_{pp}$) considerably increases with the increase of the compressive stress ($\sigma$). For instance, the magnetostriction ($\lambda_{pp}$) becomes 3.2 at $\sigma=0.4$ kg/mm$^2$. Further, the lamination factor of this comparative product is 96.5%, which is worse by about 2% than that of the product according to the invention.

As apparent from the results of Table 1 and FIGS. 3 and 4, the grain oriented silicon steel sheets according to the invention have good magnetic properties such as high magnetic flux density, extra-low iron loss and so on and are excellent in the compressive stress dependence of magnetostriction and the lamination factor.

The manufacture of the grain oriented silicon steel sheet according to the invention will be described in the order of the manufacturing steps.

As a base metal for the manufacture of grain oriented silicon steel sheets, there may be used any of conventionally well-known silicon steels, a typical example of which is a silicon steel comprising, on a weight ratio, 0.01–0.06% of C, 2.0–4.0% of Si, 0.01–0.20% of Mn, 0.005–0.05% in total of at least one of S and Se, and the remainder being substantially Fe. The other base metals include a silicon steel comprising 0.01–0.06% of C, 2.0–4.0% of Si, 0.01–0.20% of Mn, 0.005–0.05% in total of at least one of S and Se, 0.005–0.20% of Sb, and the remainder being substantially Fe; a silicon steel comprising 0.01–0.06% of C, 2.0–4.0% of Si, 0.01–0.20% of Mn, 0.005–0.05% in total of at least one of S and Se, 0.005–0.20% of Sb, 0.003–0.1% of Mo, and the remainder being substantially Fe; a silicon steel comprising 0.01–0.06% of C, 2.0–4.0% of Si, 0.01–0.20% of Mn, 0.005–0.05% in total of at least one of S and Se, 0.005–0.06% of sol. Al, 0.001–0.01% of N, and the remainder being substantially Fe; a silicon steel comprising 0.01–0.06% of C, 2.0–4.0% of Si, 0.01–0.20% of Mn, 0.005–0.05% in total of at least one of S and Se, 0.005–0.06% of sol. Al, 0.001–0.01% of N, 0.003–0.1% of Mo, and the remainder being substantially Fe; a silicon steel comprising 0.01–0.06% of C, 2.0–4.0% of Si, 0.01–0.20% of Mn, 0.005–0.05% in total of at least one of S and Se, 0.005–0.06% of sol. Al, 0.001–0.01% of N, 0.01–0.5% of Sn, 0.01–1.0% of Cu and the remainder being substantially Fe; a silicon steel comprising 0.01–0.06% of C, 2.0–4.0% of Si, 0.01–0.2% of Mn, 0.005–0.05% in total of at least one of S and Se, 0.0003–0.02% of B, 0.001–0.01% of N, and the remainder being substantially Fe; a silicon steel comprising 0.01–0.06% of C, 2.0–4.0% of Si, 0.01–0.2% of Mn, 0.005–0.05% in total of at least one of S and Se, 0.0003–0.02% of B, 0.001–0.01% of N, 0.01–1.0% of Cu, and the remainder being substantially Fe, and so on.

The reason why the compositions of the silicon steels according to the invention are limited to the above ranges is as follows:

C: 0.01–0.06%

When the amount of C is less than 0.01%, the control of hot rolled texture is difficult and large elongated grains are produced during hot rolling and consequently the magnetic properties are degraded. While, when it exceeds 0.06%, the decarburization takes a long time and is uneconomical. Therefore, the C amount is necessary to be within a range of 0.01–0.06%.

Si: 2.0–4.0%

When the amount of Si is less than 2.0%, the electric resistance is low and the value of iron loss based on the increase of eddy-current loss becomes larger, while when it exceeds 4.0%, the brittle rupture is apt to be caused in the cold rolling, so that the Si amount is necessary to be within a range of 2.0–4.0%.

Mn: 0.01–0.2%

Mn is an element required for the formation of MnS or MnSe as a dispersed precipitate phase (or an inhibitor) controlling the secondary recrystallization of the grain oriented silicon steel sheet. When the amount of Mn is less than 0.01% the amount of MnS or MnSe required for causing the secondary recrystallization is lacking as a whole, so that the secondary recrystallization is incompletely caused and at the same time the surface defect called as a blister increases. While, when it exceeds 0.2%, the dissolution/solution of MnS or MnSe and the like is difficult when heating the slab, and even if the dissolution/solution is performed, the dispersed precipitate phase or MnS or MnSe is apt to be coarsened during the hot rolling and consequently the optimum size distribution of the dispersed precipitate phase as an inhibitor is undesirably damaged and the magnetic properties are degraded. Therefore, the Mn amount is necessary to be within a range of 0.01–0.2%.

S and/or Se: 0.005–0.05% in total

When the amount of each of S and Se is less than 0.005%, the effect for inhibition of normal grain growth of MnS and MnSe is weak, while when each amount of S and Se exceeds 0.05%, the hot and cold workabilities are considerably degraded. Therefore, the amount of each of S and Se is necessary to be within a range of 0.005–0.05% and also the total amount of S and Se is necessary to be limitedto a range of 0.005–0.05%.

Mo: 0.003–0.1%

Mo is an inhibitor for normal grain growth as disclosed in Japanese Patent Application Publication Nos. 56-4,613 and 57-14,737. When the amount of Mo is less than 0.003%, the effect for inhibition of normal grain growth is not clear, while when it exceeds 0.1%, the hot and cold workabilities are degraded and also the iron loss increases, so that the Mo amount is necessary to be within a range of 0.003–0.1%.

Sb: 0.005–0.20%

As disclosed in Japanese Patent Application Publication Nos. 38-8,214 and 51-13,469, it is known that the normal grain growth is inhibited by including 0.005–0.02% of Sb in silicon steel together with a slight amount of S or Se. When the amount of Sb is less than 0.005%, the effect for inhibition of normal recrystallized grain is little, while when it exceeds 0.2%, the magnetic flux density lowers to degrade the magnetic properties. Therefore, according to the invention, the Sb amount is necessary to be within a range of 0.05–0.20%.

Sol. Al: 0.005–0.06%

Al acts as a strong inhibitor by bonding with N contained in silicon steel to form a fine precipitate of AlN. Particularly, in order to grow secondary recrystallized grains in the heavy cold rolling at a draft of 80–95%, it is necessary to include Al in an amount of 0.005–0.06% as sol. Al in the silicon steel. When the amount of sol. Al is less than 0.005%, the amount of AlN fine precipitate as an inhibitor is lacking and the growth of secondary recrystallized grain with {110}<001> orientation is insufficient, while when it exceeds 0.06%, the growth of secondary recrystallized grain with {110}<001> orientation becomes rather bad.

B: 0.0003–0.02%

B bonds with N contained in the silicon steel to form fine precipitate of BN, but when the amount of B is too large, it is difficult to grow the secondary recrystallized grain with {110}<001> orientation, so that the B amount is limited to a range of 0.0003–0.02%. Moreover, it is already known from H. E. Grenoble, *IEEE Trans. Mag.* MAG-13 (1977), p. 1427 and H. C. Fiedler, *IEEE Trans. Mag.* MAG-13 (1977), p. 1433 that the slight amount of B or BN fine precipitate effectively inhibits the grain boundary migration as an inhibitor.

N: 0.001–0.01%

N forms fine precipitate of AlN or BN by bonding with sol. Al or B contained in the silicon steel and acts as a strong inhibitor for inhibiting the growth of normal recrystallized grain. Therefore, the amount of N is necessary to be within a range of 0.001–0.01%. When the N amount is less than 0.001%, the amount of AlN or BN fine precipitate is lacking and the inhibition effect is weak and consequently the growth of secondary recrystallized grain with {110}<001> orientation is insufficient. While, when it exceeds 0.01%, the amount of solute N increases to bring about the increase of iron loss.

According to the invention, a small amount of at least one inhibitor-forming element selected from Cr, Ti, V, Zr, Nb, Ta, Co, Ni, Cu, Sn, P, As, Bi, Te and the like may be added to the silicon steel. For instance, as shown in the following Table 2, composition (c) or in K. Iwayama et al, "Roles of Tin and Copper in the 0.23 mm-Thick High Permeability Grain Oriented Silicon Steel", *J. Appl. Phys.*, 55(1984), p 2136, it is effective to add small amounts of Cu and Sn to the silicon steel according to the invention. Lately, a tendency of thinning the product thickness for the reduction of iron loss becomes stronger, but in this case the secondary recrystallization becomes unstable. Therefore, it is desirable to add about 0.01-0.5% of Sn, and further the addition of about 0.01-1.0% of Cu is favorable for the stabilization of the thin coat.

The grain oriented silicon steel sheet according to the invention is manufactured as follows.

At first, the components having a given base metal composition are melted in the conventionally well-known steel making furnace such as LD converter, electric furnace, open hearth or the like and then cast into a slab. It is a matter of course that vacuum treatment or vacuum dissolution may be applied during the melting.

After the resulting slab is subjected to a hot rolling in the usual manner, the resulting hot rolled steel sheet is subjected to a normalized annealing at a temperature of 800°-1,200° C., and, if necessary, to a subsequent quenching treatment. Then, the thus treated sheet is cold rolled to a final product thickness of 0.5-0.35 mm by a heavy cold rolling at once or by a two-times cold rolling through an intermediate annealing usually performed at 850°-1,050° C. In the latter case, the draft is 50-80% in the first cold rolling and 30-80% in the second cold rolling.

The final cold rolled steel sheet is degreased and subjected to decarburization and primary recrystallization annealing in a wet hydrogen atmosphere at 750°-850° C.

Then, the thus treated surface of the steel sheet is coated with an annealing separator. In this case, according to the invention, the feature that forsterite always produced after the final annealing in the prior art is not formed is effective for simplifying the subsequent mirror finishing of the steel sheet surface. Therefore, it is preferable to use an annealing separator composed mainly of MgO as well as a mixture of MgO and not less than 50% of $Al_2O_3$, $ZrO_2$, $TiO_2$ or the like.

After the application of the annealing separator, a secondary recrystallization annealing is performed for sufficiently growing secondary recrystallized grains with {110}<001> orientation. In general, this treatment is carried out by box annealing wherein the temperature of the steel sheet is rapidly raised to more than 1,000° C. and then held at that temperature for a given time. Moreover, it is advantageous that the isothermal annealing at a temperature of 820°-900° C. is carried out in order to highly grow the secondary recrystallized texture with {110}<001> orientation. Besides, a slow temperature-rise annealing at a rate of 0.5°-15° C./hr may be performed.

After the secondary recrystallization annealing, it is required that a purification annealing is carried out in a dry hydrogen atmosphere at a temperature above 1,100° C. for 1-20 hours.

Then, the forsterite layer or oxide layer produced on the steel sheet surface is removed from this surface by a chemical removing process such as well-known pickling or the like, a mechanical removing process such as cutting, grinding or the like, or a combination of these processes.

After the removal of the oxide, the steel sheet surface is rendered into a mirror finished state having a center-line average roughness of not more than 0.4 μm by the conventional process such as chemical polishing, electropolishing, buffing, or a combination thereof, if necessary.

After the removal of the oxide or the mirror finishing, a thin coat of at least one layer composed of at least one of nitrides and carbides of Ti, Zr, Hf, V, Nb, Ta, Mn, Cr, Mo, W, Co, Ni, Al, B and Si is formed on the steel sheet surface by CVD process, PVD process (ion plating, ion implantation) or the like. In this case, the thin coat is effective to have a thickness of about 0.005-2 μm.

Further, an insulation coating consisting mainly of phosphate and colloidal silica is formed on the thin coat by the conventionally well-known process such as baking or the like. The formation of such an insulation coating is, of course, required in the manufacture of transformers having a capacity as large as 1,000,000 KVA.

The following examples are given in illustration of the invention and are not intended as limitations thereof.

EXAMPLE 1

(a) C=0.043%, Si=3.36%, Mn=0.072%, Sb=0.025%, Mo=0.025%, Se=0.023%
(b) C=0.036%, Si=3.08%, Mn=0.065%, S=0.018%
(c) C=0.055%, Si=3.43%, Mn=0.078%, sol. Al=0.028%, S=0.030%, N=0.0068%, Sn=0.08%, Cu=0.1%
(d) C=0.038%, Si=3.26%, Mn=0.058%, S=0.026%, B=0.0038%, Cu=0.3%, N=0.0059%

Three hot rolled steel sheets of the above chemical compositions (a), (b) and (d) were subjected to a normalized annealing at 950° C. for 3 minutes, respectively. A hot rolled steel sheet of the above chemical composition (c) was subjected to a normalized annealing at 1,150° C. for 3 minutes and then quenched. Thereafter, the steel sheets (a) and (b) were subjected to a cold rolling two times through an intermediate annealing at 950° C. to obtain final cold rolled steel sheets (a) and (b) of 0.23 mm in thickness. The steel sheets (c) and (d) were subjected to a heavy cold rolling to obtain final cold rolled sheets (a) and (d) of 0.23 mm in thickness. Then, these cold rolled steel sheets were subjected to decarburization and primary recrystallization annealing in a wet hydrogen atmosphere at 820° C., and coated with a slurry of an annealing separator composed of $Al_2O_3$ (70%) and MgO (30%).

Subsequently, the steel sheet (a) was subjected to a secondary recrystallization annealing by holding at 850° C. for 50 hours, and then to a purification annealing in a dry hydrogen atmosphere at 1,200° C. for 6 hours. On the other hand, each of the steel sheets (b), (c) and (d) was subjected to a secondary recrystallization annealing by raising the temperature from 850° C. to 1,050° C. at a rate of 8° C./hr, and then to a purification annealing in a dry hydrogen atmosphere at 1,200° C. for 10 hours.

Thereafter, the surface of each of these steel sheets was pickled to remove oxides therefrom, and then rendered into a mirror finished state by electropolishing. Then, after a thin coat of TiN (0.8 μm thickness) was formed on the finished surface of the steel sheet by using an ion plating apparatus, an insulation coating was further formed thereon. The magnetic properties and the lamination factor of the resulting products are shown in the following Table 2.

For comparative purpose, comparative products were obtained according to the conventional method. That is, after the decarburization and primary recrystallization annealing, the surface of the steel sheet was coated with a slurry of an annealing separator composed mainly of MgO, and then subjected to secondary recrystallization annealing and purification annealing in the same heat cycle as mentioned above. Thereafter, an insulation coating was formed thereon, and results are also shown in Table 2.

TABLE 2

| Steel components | Product according to the invention (TiN thin coat) | | | Comparative product obtained by conventional method | | |
|---|---|---|---|---|---|---|
| | $B_{10}$ (T) | $W_{17/50}$ (W/kg) | Lamination factor (%) | $B_{10}$ (T) | $W_{17/50}$ (W/kg) | Lamination factor (%) |
| (a) C 0.043%, Si 3.36%, Mn 0.072%, Sb 0.025%, Mo 0.025%, Se 0.023% | 1.92 | 0.69 | 98.5 | 1.89 | 0.88 | 96.5 |
| (b) C 0.036%, Si 3.08%, Mn 0.065%, S 0.018% | 1.90 | 0.79 | 98 | 1.87 | 0.96 | 96 |
| (c) C 0.055%, Si 3.43%, Mn 0.078%, sol. Al 0.028%, S 0.030%, N 0.0068%, Sn 0.08%, Cu 0.1% | 1.94 | 0.71 | 98.5 | 1.93 | 0.90 | 96 |
| (d) C 0.038%, Si 3.26%, Mn 0.058%, S 0.026%, B 0.0038%, Cu 0.3%, N 0.0059% | 1.93 | 0.73 | 98.5 | 1.92 | 0.93 | 96 |

As seen from Table 2, as compared with the comparative products, the products provided with TiN thin coat according to the invention exhibit much improvement in that $B_{10}$, $W_{17/50}$ and the lamination factor were enhanced by 0.01–0.03 T, 0.17–0.20 W/kg, and 2–2.5%, respectively.

EXAMPLE 2

A hot rolled silicon steel sheet (1.8 mm thickness) containing 0.056% of C, 3.39% of Si, 0.068% of Mn, 0.018% of S, 0.025% of sol. Al and 0.0076% of N was subjected to a normalized annealing at 1,050° C. for 3 minutes, and then to a cold rolling two times through an intermediate annealing at 950° C. to obtain a final cold rolled steel sheet of 0.23 mm in thickness. Then, after decarburization and primary recrystallization annealing was carried out at 820° C. for 3 minutes, the resulting steel sheet was coated with a slurry of an annealing separator composed of Al₂O₃ (60%), MgO (25%), ZrO₂ (10%) and TiO₂ (5%).

Thereafter, secondary recrystallization annealing was carried out by holding the temperature at 850° C. for 50 hours. Subsequently, after purification annealing was carried out in a dry hydrogen atmosphere at 1,200° C. for 6 hours, oxides were removed from the surface of the steel sheet through pickling, and the steel sheet surface was rendered into a mirror finished state by electropolishing. Then, various thin coats (about 0.6–0.7 µm in thickness) were formed onto the mirror finished surfaces of the steel sheets by using CVD (no mark in Table 3), ion plating ("o" in Table 3), or ion implantation ("Δ" in Table 3), and an insulation coating consisting mainly of a phosphate and colloidal silica was formed thereon. The magnetic properties of the resulting products are shown in the following Table 3.

TABLE 3

| Run No. | Kind of compound | | $B_{10}$ (T) | $W_{17/50}$ (W/kg) |
|---|---|---|---|---|
| (1) | Nitride | TiN o | 1.95 | 0.76 |
| (2) | | BN | 1.96 | 0.72 |
| (3) | | Si₃N₄ | 1.95 | 0.71 |

TABLE 3-continued

| Run No. | Kind of compound | | $B_{10}$ (T) | $W_{17/50}$ (W/kg) |
|---|---|---|---|---|
| (4) | | ZrN | 1.94 | 0.70 |
| (5) | | AlN | 1.94 | 0.76 |
| (6) | Carbide | Ti(CN) Δ | 1.96 | 0.69 |
| (7) | | TiC o | 1.95 | 0.71 |
| (8) | | SiC o | 1.95 | 0.68 |
| (9) | | ZrC | 1.95 | 0.71 |
| (10) | | WC | 1.96 | 0.70 |
| (11) | | Mo₂C | 1.94 | 0.69 |
| (12) | | Cr₇C₃ | 1.95 | 0.68 |

EXAMPLE 3

A hot rolled steel sheet containing 0.043% of C, 3.37% of Si, 0.063% of Mn, 0.025% of Mo, 0.022% of Se, and 0.025% of Sb was prepared.

This hot rolled steel sheet was subjected to a normalized annealing at 900° C. for 3 minutes, and then to a cold rolling two times through an intermediate annealing at 950° C. to obtain a final cold rolled steel sheet of 0.23 mm in thickness.

Thereafter, the resulting steel sheet was subjected to a decarburization annealing in a wet hydrogen atmosphere at 820° C., and coated with a slurry of an annealing separator composed of Al₂O₃ (75%), MgO (20%), and ZrO₂ (5%). The coated steel sheet was subjected to a secondary recrystallization annealing at 850° C. for 50 hours, and then to a purification annealing in H₂ at 1,200° C. for 8 hours.

Subsequently, the surface of the steel sheet was pickled to remove oxide layer therefrom, and subjected to a chemical polishing with a mixed solution of 3% HF and H₂O₂ to render the surface into a mirror finished state. Thin coats of various compounds, that is, Cr₂N, BN, Si₃N₄, ZrN and AlN as nitrides, and TaC, NbC, SiC, ZrC, WC, Mo₂C and Cr₇C₃ as carbides were formed all in a thickness of 0.7–0.9 µm by using CVD (no mark in Table 4), ion plating ("o" in Table 4) or ion implantation ("Δ" in Table 4).

Then, an insulation coating consisting mainly of a phosphate and colloidal silica was baked onto the surface of each of the thin coats, which was subjected to a strain relief annealing at 800° C. for 2 hours.

The magnetic properties, compressive stress dependence of magnetostriction (values $\lambda_{pp}$ of magnetostriction when the compressive stress $\sigma$ is 0.4 and 0.6 kg/mm²) of the resulting products are shown in the following Table 4.

TABLE 4

| Run No. | Kind of compound | | Magnetic properties | | $\lambda_{pp}$ (× 10$^{-6}$) | |
|---|---|---|---|---|---|---|
| | | | $B_{10}$ (T) | $W_{17/50}$ (W/kg) | $\sigma$: 0.4 kg/mm$^2$ | $\sigma$: 0.6 kg/mm$^2$ |
| (1) | Nitride | Cr$_2$N o | 1.91 | 0.78 | 0.15 | 0.60 |
| (2) | | BN | 1.92 | 0.82 | 0.21 | 0.63 |
| (3) | | Si$_3$N$_4$ | 1.92 | 0.84 | 0.23 | 0.62 |
| (4) | | ZrN | 1.91 | 0.73 | 0.21 | 0.53 |
| (5) | | AlN | 1.91 | 0.72 | 0.18 | 0.63 |
| (6) | Carbide | TaC Δ | 1.92 | 0.78 | 0.19 | 0.66 |
| (7) | | NbC o | 1.91 | 0.76 | 0.22 | 0.67 |
| (8) | | SiC o | 1.92 | 0.76 | 0.13 | 0.68 |
| (9) | | ZrC | 1.91 | 0.74 | 0.10 | 0.78 |
| (10) | | WC | 1.91 | 0.73 | 0.21 | 0.72 |
| (11) | | Mo$_2$C | 1.91 | 0.81 | 0.22 | 0.76 |
| (12) | | Cr$_7$C$_3$ | 1.91 | 0.82 | 0.11 | 0.49 |

EXAMPLE 4

A grain oriented silicon steel sheet containing 0.56% of C, 3.29% of Si, 0.078% of Mn, 0.025% of Al, 0.030% of S, 0.1% of Cu and 0.05% of Sn was heated at 1,440° C. for 5 hours, and then hot rolled to obtain a hot rolled steel sheet of 1.6-2.7 mm in thickness.

Then, the steel sheet was subjected to a normalized annealing at 1,100° C. for 3 minutes, and then quenched. Thereafter, the resulting steel sheet was warm rolled at 350° C. to obtain a final rolled steel sheet of 0.20, 0.23, 0.27 or 0.30 mm in thickness.

Subsequently, the rolled steel sheet was subjected to decarburization and primary recrystallization annealing in a wet hydrogen atmosphere at 850° C., and then coated with a slurry of an annealing separator composed of Al$_2$O$_3$ (70%), MgO (20%), TiO$_2$ (5%), and ZrO$_2$ (5%). The coated steel sheet was subjected to a secondary recrystallization annealing at 850° C. for 50 hours, and then to a purification annealing in a dry hydrogen atmosphere at 1,200° C. for 5 hours.

Then, the steel sheet was pickled to remove oxides therefrom, and subjected to an electropolishing to render the surface into a mirror finished state.

Thereafter, a thin coat of Cr$_2$N was formed by using PVD (ion plating apparatus), and then an insulation coating consisting mainly of a phosphate and colloidal silica was baked thereon. The baked steel sheet was subjected to a strain relief annealing at 800° C. for 3 hours. The thickness of Cr$_2$N thin coat, and the magnetic properties, compressive stress dependence of magnetostriction (values $\lambda_{pp}$ of magnetostriction when the compressive stress $\sigma$ is 0.4 kg/mm$^2$ and 0.6 kg/mm$^2$), and the lamination factor (%) of the resulting products are shown in the following Table 5.

EXAMPLE 5

Hot rolled steel sheets having the following chemical composition were prepared:
(a) C=0.042%, Si=3.36%, Mn=0.062%, Mo=0.024%, Se=0.021%, and Sb=0.025%; and
(b) C=0.056%, Si=3.36%, Mn=0.068%, Al=0.026%, S=0.029%, N=0.0069%, Cu=0.1%, and Sn=0.05%

First, the hot rolled steel sheet (a) was subjected to a normalized annealing at 900° C. for 3 minutes, and then to a cold rolling two times through an intermediate annealing at 950° C. to obtain a final cold rolled steel sheet of 0.20 mm in thickness.

On the other hand, the hot rolled steel sheet (b) was subjected to a normalized annealing at 1,080° C. for 3 minutes and quenched, and then warm rolled at 300° C. to obtain a final rolled steel sheet of 0.20 mm in thickness.

Then, each of the rolled steel sheets was subjected to decarburization annealing in a wet hydrogen atmosphere at 830° C., and coated with a slurry of an annealing separator composed of Al$_2$O$_3$ (75%), MgO (20%), and ZrO$_2$ (5%). The resulting sample with the composition (a) was subjected to a secondary recrytallization annealing at 850° C. for 50 hours, and then to a purification annealing in a dry hydrogen atmosphere at 1,200° C. for 5 hours. The resulting sample with the composition (b) was heated from 850° C. to 1,050° C. at 5° C./hr for second recrystallization, and then subjected to a purification annealing in a dry hydrogen atmosphere at 1,200° C. for 8 hours.

Thereafter, an oxide layer was removed through pickling, and then a chemical polishing was carried out with a mixed solution of 3% HF and H$_2$O$_2$ to effect mirror finishing.

Then, by using a CVD device, (i) TiN thin coat, (ii) Ti(CN) thin coat and (iii) TiC thin coat were formed all in a thickness of 0.7 μm from a mixed gas of TiCl$_4$, H$_2$ and N$_2$, a mixed gas of TiCl$_4$, H$_2$, N$_2$ and CH$_4$, and a mixed gas of TiCl$_4$, H$_2$, N$_2$ and CH$_4$, respectively. By using an ion plating or ion implantation apparatus, thin coats of (iv) Ti(CN) and (v) TiC were formed in a thickness of 0.7–0.9 μm.

Subsequently, an insulation coating consisting mainly of a phosphate and colloidal silica was baked onto the surface of the thus treated sample, which was subjected to a strain relief annealing.

The magnetic properties and compressive stress dependence of magnetostriction (values $\lambda_{pp}$ of magneotostriction when compressive stress $\sigma$ is 0.4 and 0.6 kg/mm$^2$) of the resulting products are shown in the

TABLE 5

| Thickness of product (mm) | Thickness of Cr$_2$N thin coat (μm) | Magnetic properties | | $\lambda_{pp}$ (× 10$^{-6}$) | | Lamination factor (%) |
|---|---|---|---|---|---|---|
| | | $B_{10}$ (T) | $W_{17/50}$ (W/kg) | $\sigma$:0.4 kg/mm$^2$ | $\sigma$:0.6 kg/mm$^2$ | |
| 0.30 | 1.10 | 1.94 | 0.91 | 0.15 | 0.63 | 99.0 |
| 0.27 | 1.02 | 1.95 | 0.82 | 0.19 | 0.66 | 98.8 |
| 0.23 | 0.75 | 1.93 | 0.75 | 0.20 | 0.62 | 98.5 |
| 0.20 | 0.50 | 1.93 | 0.68 | 0.22 | 0.68 | 98.1 | following Table 6.

TABLE 6

| Kind of steel | Process | TiN | | Ti (CN) | | TiC | | $\lambda_{pp}$ (× 10$^{-6}$) | |
|---|---|---|---|---|---|---|---|---|---|
| | | $B_{10}$(T) | $W_{17/50}$(W/kg) | $B_{10}$(T) | $W_{17/50}$(W/kg) | $B_{10}$(T) | $W_{17/50}$(W/kg) | 0.4 kg/mm$^2$ | 0.6 kg/mm$^2$ |
| (a) | CVD (i), (ii), (iii) | 1.92 | 0.68 | 1.92 | 0.67 | 1.92 | 0.66 | 0.2 | 0.5 |

TABLE 6-continued

| Kind of steel | Process | TiN | | Ti (CN) | | TiC | | $\lambda_{pp}$ ($\times 10^{-6}$) | |
|---|---|---|---|---|---|---|---|---|---|
| | | $B_{10}(T)$ | $W_{17/50}$(W/kg) | $B_{10}(T)$ | $W_{17/50}$(W/kg) | $B_{10}(T)$ | $W_{17/50}$(W/kg) | 0.4 kg/mm² | 0.6 kg/mm² |
| | Ion plating (iv) | — | — | 1.92 | 0.65 | — | — | 0.2 | 0.4 |
| | Ion implantation (v) | — | — | — | — | 1.92 | 0.69 | 0.1 | 0.3 |
| (b) | CVD (i), (ii), (iii) | 1.92 | 0.66 | 1.95 | 0.68 | 1.95 | 0.69 | 0.2 | 0.6 |
| | Ion plating (iv) | — | — | 1.94 | 0.67 | — | — | 0.2 | 0.5 |
| | Ion implantation (v) | — | — | — | — | 1.95 | 0.68 | 0.1 | 0.4 |

EXAMPLE 6

A grain oriented silicon steel sheet containing 0.043% of C, 3.42% of Si, 0.069% of Mn, 0.021% of Se, 0.025% of Sb and 0.025% of Mo was heated at 1,400° C. for 3 hours, and then hot rolled to obtain a hot rolled steel sheet of 1.8–2.7 mm in thickness. Thereafter, the hot rolled steel sheet was subjected to a normalized annealing at 900° C. for 3 minutes, and then to a cold rolling two times through an intermediate annealing at 950° C. for 30 minutes to obtain a final cold rolled steel sheet of 0.20, 0.23, 0.27 or 0.30 mm in thickness.

Thereafter, the cold rolled steel sheet was subjected to decarburization and primary recrystallization annealing in a wet hydrogen atmosphere at 830° C. and then coated with a slurry of an annealing separator composed of MgO (20%), Al₂O₃ (70%), TiO₂ (5%), and ZrO₂ (5%). Then, the coated steel sheet was subjected to a secondary recrystallization annealing at 850° C. for 50 hours, and then to a purification annealing in a dry hydrogen atmosphere at 1,200° C. for 5 hours. After oxides on the surface of the steel sheet were removed through lightly pickling, the surface of the steel sheet was rendered into a mirror finished state by electropolishing.

Then, a TiN thin coat was formed by using PVD (ion plating apparatus), and an insulation coating consistig mainly of a phosphate and colloidal silica was baked thereon, which was subjected to a strain relief annealing at 800° C. for 3 hours. The thickness of the TiN thin coat and the magnetic properties, compressive stress dependence of magnetostriction (values $\lambda_{pp}$ of magnetostriction when the compressive stress $\sigma$ is 0.4 kg/mm² and 0.6 kg/mm²) of the resulting products are shown in the following Table 7.

TABLE 7

| Thickness of product (mm) | Thickness of TiN thin coat (μm) | Magnetic properties | | Compressive stress dependence of magnetostriction $\lambda_{pp}$ ($\times 10^{-6}$) | |
|---|---|---|---|---|---|
| | | $B_{10}$ (T) | $W_{17/50}$ (W/kg) | $\sigma$: 0.4 kg/mm² | $\sigma$: 0.6 kg/mm² |
| 0.30 | 1.10 | 1.92 | 0.90 | 0.2 | 0.3 |
| 0.27 | 1.02 | 1.92 | 0.82 | 0.1 | 0.15 |
| 0.23 | 0.75 | 1.91 | 0.74 | 0.1 | 0.2 |
| 0.20 | 0.50 | 1.92 | 0.69 | 0.2 | 0.35 |

EXAMPLE 7

A grain oriented silicon steel sheet containing 0.044% of C, 3.45% of Si, 0.066% of Mn, 0.023% of Se, 0.025% of Sb, and 0.026% of Mo was heated at 1,360° C. for 4 hours, and then hot rolled to obtain a hot rolled steel sheet of 2.2 mm in thickness. Then, the hot rolled steel sheet was subjected to a normalized annealing at 900° C. for 3 minutes, and then to a cold rolling two times through an intermediate annealing at 950° C. for 3 minutes to obtain a final cold rolled steel sheet of 0.23 mm in thickness.

Then, the cold rolled steel sheet was subjected to decarburization and primary recrystallization annealing in a wet hydrogen atmosphere at 820° C., and coated with a slurry of an annealing separator composed of Al₂O₃ (60%), MgO (30%), ZrO₂ (5%) and TiO₂ (5%). The coated steel sheet was subjected to a secondary recrystallization annealing at 850° C. for 50 hours, and then to a purification annealing in a dry hydrogen atmosphere at 1,200° C. for 8 hours. Thereafter, oxides on the surface of the steel sheet were removed through lightly pickling, and the surface of the steel sheet was rendered into a mirror finished state through electropolishing.

Then, a TiN thin coat was formed by using various ion plating apparatuses according to (a) magnetron sputtering method, (b) EB (Electron Beam)+RF (Radio Frequency) method, (c) HCD (Hollow Cathode Discharge) method, or (d) Multi Arc method. The results on the X-ray diffraction of the TiN thin coat and the magnetic properties of the resulting products are shown in the following Table 8.

TABLE 8

| Run No. | Kind of ion plating method | Magnetic properties | | X-ray diffractometry of thin coat |
|---|---|---|---|---|
| | | $B_{10}$ (T) | $W_{17/50}$ (W/kg) | |
| (a) | Magnetron sputtering | 1.91 | 0.70 | TiN peaks only |
| (b) | EB + RF | 1.92 | 0.70 | TiN peaks mainly Ti peaks very small |
| (c) | HCD | 1.92 | 0.69 | TiN peaks mainly Ti₂N peaks small Ti peaks small |
| (d) | Multi Arc | 1.92 | 0.72 | TiN peaks only |

As apparent from Table 8, the magnetic properties in the formation of the TiN thin coat according to four types of the ion plating methods are extremely excellent in that $B_{10}$ is 1.91–1.92 T and $W_{17/50}$ is 0.69–0.72 W/kg. According to the results on the X-ray diffraction of the thin coats on the surface of the steel sheet, only TiN peaks were detected in the condition of (a) and (d), and in the condition (b), although the TiN peaks were main peaks, Ti peaks were slightly detected, while in the condition (c), TiN peaks were main peaks, but Ti₂N and Ti peaks were slightly detected. However, such slight amounts of other peaks than those of TiN will not give a large influence upon the magnetic properties.

EXAMPLE 8

A hot rolled steel sheet containing 0.043% of C, 3.36% of Si, 0.063% of Mn, 0.026% of Mo, 0.021% of Se and 0.025% of Sb was subjected to a cold rolling two times through an intermediate a process annealing at 950° C. for 3 minutes to obtain a final cold rolled steel sheet of 0.23 mm in thickness. Then, the cold rolled steel sheet was subjected to decarburization and primary recrystallization annealing in a wet hydrogen atmosphere at 820° C., and coated with a slurry of an annealing separator composed of $Al_2O_3$ (70%), MgO (25%) and $ZrO_2$ (5%). The coated steel sheet was subjected to a secondary recrystallization annealing at 850° C. for 50 hours, and then to a purification annealing in a dry hydrogen atmosphere at 1,200° C. for 7 hours.

Thereafter, an oxide layer on the surface of the steel sheet was removed through pickling, and a chemical polishing was carried out to render the surface into a mirror finished state having a center-line average roughness of not more than 0.04 μm. Then, a metal or a semimetal as shown in the following Table 9 was deposited thereon at a thickness of 0.7–0.8 μm.

Next, the resulting product was annealed in an atmosphere containing $N_2$ or $CH_4$ to form a mixed thin coat consisting of various carbides and nitrides.

Then, an insulation coating consisting mainly of a phosphate and colloidal silica was formed onto the thin coat. The magnetic properties and adhesion property of the resulting product were examined to obtain results as shown in Table 9.

thickness of $Si_3N_4$, (3) 0.2 μm thickness of ZrN, (4) 0.3 μm thickness of AlN, or (5) 0.3 μm thickness of TiC was carried out. In (6) and (7) of Table 10, Ti(CN) (0.3 μm in thickness) was ion plated and then the ion plating of (6) 0.5 μm thickness of $Cr_2N$ or (7) 0.5 μm thickness of HfN was carried out.

The magnetic properties of the thus obtained products are shown in Table 10.

TABLE 10

| Run No. | Formation of thin coats | $B_{10}$ (T) | $W_{17/50}$ (W/kg) |
|---|---|---|---|
| (1) | BN (0.4 μm) formed on TiN (0.3 μm) | 1.91 | 0.69 |
| (2) | $Si_3N_4$ (0.3 μm) formed on TiN (0.3 μm) | 1.91 | 0.71 |
| (3) | ZrN (0.2 μm) formed on TiN (0.3 μm) | 1.91 | 0.68 |
| (4) | AlN (0.3 μm) formed on TiN (0.3 μm) | 1.92 | 0.66 |
| (5) | TiC (0.3 μm) formed on TiN (0.3 μm) | 1.92 | 0.65 |
| (6) | $Cr_2N$ (0.5 μm) formed on Ti(CN) (0.3 μm) | 1.92 | 0.64 |
| (7) | HfN (0.5 μm) formed on Ti(CN) (0.3 μm) | 1.92 | 0.66 |

TABLE 9

| Run No. | Vapor-deposited metal or semimetal | Heat treating conditions | Kind of thin coat | $B_{10}$(T) | $W_{17/50}$(W/kg) | Adhesion property* (mm) |
|---|---|---|---|---|---|---|
| (1) | Ti | Annealing in $N_2 + H_2$ at 750° C. for 10 hours | TiN | 1.92 | 0.74 | 20 |
| (2) | Ti | Annealing in $CH_4 + H_2$ at 750° C. for 8 hours | TiC | 1.92 | 0.75 | 20 |
| (3) | Ti | Annealing in $CH_4 + N_2 + H_2$ at 800° C. for 5 hours | TiN, TiC, Ti(CN) | 1.92 | 0.73 | 20 |
| (4) | Cr | Annealing in $N_2 + H_2$ at 800° C. for 10 hours | $Cr_2N$ | 1.91 | 0.78 | 20 |
| (5) | Cr | Annealing in $CH_4 + N_2 + H_2$ at 800° C. for 15 hours | $Cr_2N$, $Cr_7C_3$ | 1.92 | 0.76 | 20 |
| (6) | Zr | Annealing in $N_2 + H_2$ at 850° C. for 10 hours | ZrN | 1.91 | 0.79 | 25 |
| (7) | Al | Annealing in $N_2 + H_2$ at 900° C. for 10 hours | AlN | 1.91 | 0.78 | 20 |
| (8) | V | Annealing in $N_2 + H_2$ at 900° C. for 9 hours | VN | 1.91 | 0.77 | 20 |
| (9) | Hf | Annealing in $N_2 + H_2$ at 1,000° C. for 6 hours | HfN | 1.91 | 0.78 | 20 |
| (10) | Si | Annealing in $N_2 + H_2$ at 1,000° C. for 10 hours | $Si_3N_4$ | 1.91 | 0.77 | 25 |

*Diameter causing no peeling at 180° bending

EXAMPLE 9

A hot rolled steel sheet containing 0.042% of C, 3.38% of Si, 0.065% of Mn, 0.025% of Mo, 0.022% of Se, and 0.025% of Sb was subjected to a normalized annealing at 900° C. for 3 minutes, and then to a cold rolling two times through an intermediate annealing at 950° C. to obtain a final cold rolled steel sheet of 0.20 mm in thickness.

Then, the cold rolled steel sheet was subjected to decarburization annealing in a wet hydrogen atmosphere at 820° C., and coated with a slurry of an annealing separator composed of $Al_2O_3$ (70%), $ZrO_2$ (5%), $TiO_2$ (1%), and MgO (24%). The coated steel sheet was subjected to a secondary recrystallization annealing at 850° C. for 50 hours, and then to a purification annealing in a dry hydrogen atmosphere at 1,200° C. for 10 hours.

Thereafter, the surface of the steel sheet was pickled to remove an oxide layer, and a chemical polishing was carried out with a mixed solution of 3% HF and $H_2O_2$ to render the surface into a mirror finished state.

After TiN (0.3 μm in thickness) was ion plated as shown in the formations of thin coats, (1)–(5), of Table 10, ion plating of (1) 0.4 μm thickness of BN, (2) 0.3 μm

EXAMPLE 10

(a) C=0.042%, Si=3.09%, Mn=0.065%, Sb=0.026%, Se=0.021%
(b) C=0.046%, Si=3.07%, Mn=0.072%, sol.Al=0.026%, N=0.0063%, S=0.028%
(c) C=0.052%, Si=3.39%, Mn=0.074%, sol.Al=0.028%, N=0.0073%, Se=0.024%, Mo=0.028%
(d) C=0.042%, Si=3.06%, Mn=0.055%, B=0.0026%, N=0.0069%

Four hot rolled steel sheets were subjected to a normalized annealing at 900° C. for 3 minutes in case of the chemical composition (a), at 1,150° C. for 3 minutes in case of the chemical compositions (b) and (c), and at 1,000° C. for 3 minutes in case of the chemical composition (d), respectively. Thereafter, each of the above steel sheets was subjected to a cold rolling two times through an intermediate annealing at 950° C. to obtain a final cold rolled steel sheet of 0.23 mm in thickness.

Then, these cold rolled steel sheets were subjected to decarburization and primary recrystallization annealing in a wet hydrogen atmosphere at 820° C., and coated with a slurry of an annealing separator composed of Al$_2$O$_3$ (60%), MgO (35%), ZrO$_2$ (3%) and TiO$_2$ (2%).

Subsequently, the steel sheet (a) was subjected to a secondary recrystallization annealing by holding at 850° C. for 50 hours, and then to a purification annealing in a dry hydrogen atmosphere at 1,200° C. for 8 hours. On the other hand, each of the steel sheets (b), (c) and (d) was subjected to a secondary recrystallization annealing by raising the temperature from 850° C. to 1,050° C. at a rate of 10° C./hr, and then to a purification annealing in a dry hydrogen atmosphere at 1,200° C. for 10 hours.

Thereafter, the surface of each of these steel sheets was lightly pickled to remove oxides therefrom, and then rendered into a mirror finished state by electropolishing. Then, after a thin coat of TiN (about 1.0 μm thickness) was formed on the finished surface of the steel sheet by using a CVD apparatus. The magnetic properties and the lamination factor of the resulting products are shown in the following Table 11.

TABLE 11

| Steel components | Magnetic properties | | Lamination factor (%) |
| --- | --- | --- | --- |
| | $B_{10}$ (T) | $W_{17/50}$ (W/kg) | |
| (a) C 0.042%, Si 3.09%, Mn 0.065%, Sb 0.026%, Se 0.021% | 1.92 | 0.76 | 98.5 |
| (b) C 0.046%, Si 3.07%, Mn 0.072%, S 0.028%, sol.Al 0.026%, N 0.0063% | 1.94 | 0.77 | 98 |
| (c) C 0.052%, Si 3.39%, Mn 0.074%, sol.Al 0.028%, N 0.0073%, Se 0.024% No 0.028% | 1.94 | 0.73 | 98.5 |
| (d) C 0.042%, Si 3.06%, Mn 0.055%, B 0.0026%, N 0.0069%, Se 0.021% | 1.93 | 0.78 | 98 |

What is claimed is:

1. An extra-low iron loss grain oriented silicon steel sheet comprising a base metal of grain oriented silicon steel and a thin coat of at least one layer composed of at least one of nitrides and carbides of Ti, Zr, Hf, V, Nb, Ta, Mn, Cr, Mo, W, Co, Ni, Al, B and Si and strongly adhered to all finished surfaces of the base metal through a mixed layer of the base metal and the thin coat, and having a thickness of 0.005-2 μm.

2. The extra-low iron loss grain oriented silicon steel sheet according to claim 1, wherein said base metal is obtained by starting from a silicon steel comprising 0.01-0.06% by weight of C, 2.0-4.0% by weight of Si, 0.01-0.20% by weight of Mn, 0.005-0.05% by weight in total of at least one of S and Se, and the remainder being substantially Fe.

3. The extra-low iron loss grain oriented silicon steel sheet according to claim 2, wherein said silicon steel further contains 0.005-0.20% by weight of Sb.

4. The extra-low iron loss grain oriented silicon steel sheet according to claim 2, wherein said silicon steel further contains 0.005-0.20% by weight of Sb and 0.003-0.1% by weight of Mo.

5. The extra-low iron loss grain oriented silicon steel sheet according to claim 2, wherein said silicon steel further contains 0.005-0.06% by weight of sol.Al and 0.001-0.01% by weight of N.

6. The extra-low iron loss grain oriented silicon steel sheet according to claim 2, wherein said silicon steel further contains 0.005-0.06% by weight of sol.Al, 0.003-0.1% by weight of Mo and 0.001-0.01% by weight of N.

7. The extra-low iron loss grain oriented silicon steel sheet according to claim 2, wherein said silicon steel further contains 0.005-0.06% by weight of sol.Al, 0.001-0.01% by weight of N, 0.01-0.5% by weight of Sn and 0.01-1.0% by weight of Cu.

8. The extra-low iron loss grain oriented silicon steel sheet according to claim 2, wherein said silicon steel further contains 0.0003-0.02% by weight of B and 0.001-0.01% by weight of N.

9. The extra-low iron loss grain oriented silicon steel sheet according to claim 2, wherein said silicon steel further contains 0.0003-0.02% by weight of B, 0.001-0.01% by weight of N and 0.01-1.0% by weight of Cu.

10. The extra-low iron loss grain oriented silicon steel sheet according to claim 1, wherein said thickness is 0.05-1.5 μm.

11. The extra-low iron loss grain oriented silicon steel sheet according to claim 1, wherein said thin coat is under a tension.

12. The extra-low iron loss grain oriented silicon steel sheet according to claim 1 wherein said thin coat is provided thereon with an insulating coating consisting essentially of phosphate and colloidal silica.

* * * * *